United States Patent [19]

Warnock et al.

[11] 4,399,454

[45] Aug. 16, 1983

[54] DIGITAL COMB FILTERING FOR PAL TELEVISION SIGNALS

[75] Inventors: Richard B. Warnock, Bountiful; Leonard J. Brugger, Holladay, both of Utah

[73] Assignee: Fernseh Inc., Salt Lake City, Utah

[21] Appl. No.: 170,310

[22] Filed: Jul. 16, 1980

Related U.S. Application Data

[63] Continuation-in-part of Ser. No. 49,221, Jun. 18, 1979, abandoned.

[30] Foreign Application Priority Data

Jun. 17, 1980 [EP] European Pat. Off. ........ 80103360.6
Jun. 17, 1980 [JP] Japan .................. 55-82064

[51] Int. Cl.³ ........................................... H04N 9/535
[52] U.S. Cl. ..................................... 358/16; 358/35; 358/36; 358/40
[58] Field of Search ........................ 358/16, 31, 35, 40, 358/36

[56] References Cited

U.S. PATENT DOCUMENTS

| | | | |
|---|---|---|---|
| 4,064,530 | 12/1977 | Kaiser et al. | 358/36 |
| 4,075,655 | 2/1978 | Iijima et al. | 358/13 |
| 4,096,516 | 6/1978 | Pritchard | 358/31 |
| 4,178,609 | 12/1979 | Beutel | 358/31 |

FOREIGN PATENT DOCUMENTS

| | | |
|---|---|---|
| 1941848 | 3/1973 | Fed. Rep. of Germany . |
| 2432594 | 1/1975 | Fed. Rep. of Germany . |
| 2521288 | 11/1975 | Fed. Rep. of Germany . |
| 2816367 | 11/1978 | Fed. Rep. of Germany . |
| 2810697 | 9/1979 | Fed. Rep. of Germany . |

OTHER PUBLICATIONS

Wachs, "Zur Anwendung Digitaler Nichtrekursiver Filter", Nachrichten Elektronik.

*Primary Examiner*—Robert L. Richardson

[57] ABSTRACT

A method and apparatus for comb filtering a PAL type television signal is described. Preferably, the television signal is digitized by sampling it at an even multiple of its chroma subcarrier frequency, thereby to convert the television signal to a series of digital signals representative of discrete picture elements. The value of each such digital signal is indicative of the value of the luminance component and the value of the amplitude and phase of the chroma component of its associated picture element. The phase of the chroma component of a reference picture element is changed by combining and averaging stored digital signals associated with selected picture elements whose chroma component is of the desired phase and which, in combination, cancel out luminance components. Preferably, a resultant luminance signal is also generated by combining and averaging stored digital signals associated with selected picture elements so as to cancel out their chroma components, and the resultant luminance signal is combined with the phase-changed chroma signal to develop a final signal whose chroma component is of the desired phase.

21 Claims, 4 Drawing Figures

DIGITAL COMB FILTERING FOR PAL TELEVISION SIGNALS

This application is a continuation-in-part of application Ser. No. 49,221, filed June 18, 1979 and now abandoned.

BACKGROUND OF THE INVENTION

The invention described herein is directed generally to comb filters, and particularly to a filter and method for separating the luminance and chroma components of a television signal encoded according to PAL standards.

It is well known that so-called "recursive" filters are well suited for reducing noise in repetitive signals such as television signals whose information content does not vary to a great extent from frame to frame. An example of one such filter is described in U.S. Pat. No. 4,064,530. An improved filter for television signals is described in U.S. Application Ser. No. 041,455, filed May 22, 1979, and entitled NOISE FILTER.

Common to most recursive filters for television signals is the fact that an incoming television signal is compared to a previously received television signal which has been delayed for one frame interval, for example. Depending on the differences between the incoming signal and the delayed signal, the incoming signal is altered to reduce its noise content.

In the case where the television signal has a chroma component, the filter must take into account the phase change which the chroma component undergoes from frame to frame. That is, two successive frames of a color television signal cannot be properly compared because the phases of their chroma components are not the same. To compensate for this problem, the chroma component of the delayed signal is separated from its luminance component, the chroma component is phase corrected, and then the luminance and chroma component are recombined. The delayed signal is then in proper form for comparison with the incoming television signal.

A chroma phase corrector and separator (comb filter) which achieves the functions set forth above for NTSC type television signals is disclosed in the above-mentioned patent application. However, where the filter is designed for use with television signals encoded according to the European PAL system, a different type of comb filter is required, due to the fact that the phase of the chroma component of the PAL signal varies from line to line in a more complex manner than does the NTSC signal.

Moreover, most television noise filter techniques now operate on a digitized television signal which has been sampled, as opposed to operating on an analog signal. Hence, it is necessary to employ a digital comb filter in the overall filter system. However, previous filters for PAL type television signals have been analog and/or extremely complex. There is need for a satisfactory digital type comb filter for processing PAL type television signals.

OBJECTS OF THE INVENTION

It is a general object of the invention to provide an improved comb filter and filtering method for use with PAL type television signals.

It is a more specific object of the invention to provide a digital comb filter and filtering method for use in a recursive filter for reducing noise in a PAL type television signal.

It is another object of the invention to provide a comb filter for PAL type television signals, which filter separates chroma components from luminance components, phase corrects the chrominance, and recombines it with luminance so as to enable comparison of the picture elements of one frame of video to the picture elements of the next successive frame of video.

BRIEF DESCRIPTION OF THE FIGURES

The objects stated above and other objects of the invention are more particularly set forth in the following detailed description and the accompanying drawings, of which.

SUMMARY OF THE INVENTION

According to the method and apparatus of the invention, a digitized television signal of the PAL type is processed so as to correct the phase of the chroma component of each picture element of a television frame so that each picture element of the processed frame is comparable to a correspondingly located picture element in the next successive television frame.

Preferably, the television signal is sampled at a rate corresponding to N times the television signal's chroma subcarrier frequency, where N is an even integer. The sampled signal is thus converted to a series of digital signals, each of which is associated with a discrete picture element and each of which is representative of the luminance component and the amplitude and phase of the chroma component of its associated picture element. Assuming that a reference frame of picture elements is being processed, the digital signals associated with the picture elements of a reference line (n) are stored, and the digital signals associated with the picture elements in line (n+1) and line (n−1) are also stored, where lines (n+1) and (n−1) designate lines immediately preceding and immediately following the reference line (n), respectively.

To process the stored digital signals, one picture element at a time, the stored signals associated with selective picture elements in at least one of the lines (n−1) and (n+1) are combined and averaged such that the resultant chroma signal is substantially free of luminance components and has substantially the same amplitude and phase as that of a picture element which is in the next successive frame and whose location corresponds to the location of the reference picture element.

To preferably develop such a resultant signal for each picture element in the reference frame, the same procedure is effected for each picture element in the reference line (n) and then for each picture element in the lines following line (n) in the reference frame. Thus, picture elements having corresponding locations in successive frames are given chroma components whose phase and amplitude are similar or identical so that they are in proper condition for comparison with each other.

According to another aspect of the invention, stored digital signals associated with selected picture elements are also combined and averaged so as to develop a resultant luminance signal which is substantially free of chroma components. The resultant luminance signal is combined with the resultant chroma signal for the same picture element to provide a final signal which may be compared as to luminance and chroma content of the correspondingly located picture element in the next successive frame.

DESCRIPTION OF THE PREFERRED EMBODIMENT

Figure 1:
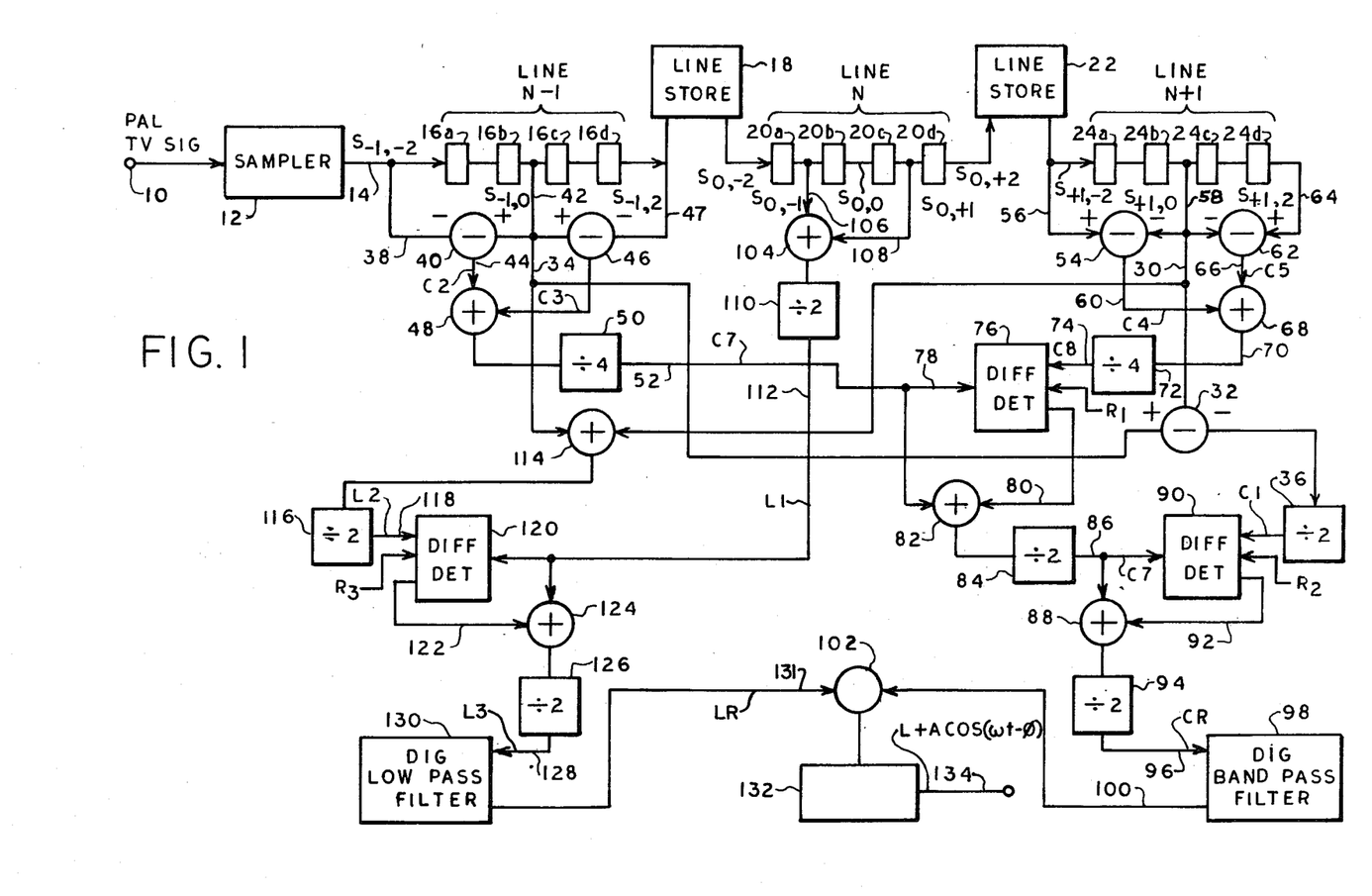
FIG. 1 illustrates a preferred embodiment of a comb filter designed to effect filtering and chroma correction according to the invention.

Referring now to FIG. 1, there is shown a comb filter for implementing the invention. The PAL television signal which is processed by the invention is applied as an analog input to a terminal 10. The terminal 10 may be coupled to the input of a sampler 12 for sampling the analog signal at a rate corresponding to N times the frequency of the color subcarrier associated with the television signal, where N is an even integer. Preferably, the sampling is effected at a rate of 4 times the subcarrier frequency to establish a sampling rate of about 17.735 megahertz. In other respects, the sampler 10 is conventional and may be constructed in a manner well known in the art.

A sampling rate of twice the subcarrier frequency may also be employed in applications where a lesser degree of resolution can be tolerated. Suffice it to say, however, that sampling the incoming television signal at an even multiple of its subcarrier frequency provides a succession of digital signals which individually represent discrete picture elements and which have a chroma component which varies symmetrically. That symmetry, described in more detail below, is exploited in the processing of the digitized television signal.

Once the television signal has been digitized, each resultant picture element is stored by coupling the output of the sampler 12 via lead 14 to a first set of registers 16a, 16b, 16c and 16d. As the digital signals leave the sampler one at a time, the first such signal is stored in the register 16a. A clocking system (not shown) shifts the signal stored in the register 16a to the register 16b in synchronism with the next output of the sampler 12. In like manner, the signal stored in register 16b is shifted to the register 16c and then to the register 16d in synchronism with the next two outputs of the sampler 12. At that time, each of the registers 16a through 16d stores a digital signal representative of the luminance and chroma components of a single picture element.

The output of the register 16d is coupled to a line store 18 for storing the digital signals for an interval corresponding to one television line. The output of the line store 18 is coupled to the first of another set of storage registers 20a through 20d for storing the outputs of the line store 18. Hence, when a digital signal has been clocked to the register 20d, the registers 20a through 20d store digital signals representative of the value of picture elements in one television line, and the registers 16a through 16d store digital signals representative of the value of picture elements in the next successive television line.

The output of the register 20d is coupled to another line store 22 and thence to another set of storage registers 24a through 24d. Hence, as the digital signals are closed through the various lines, stores and registers, the registers 20a through 20d will store digital signals associated with a reference line (n) in a reference frame of video, the registers 24a through 24d will store digital signals associated with a previous line (n+1) in the same frame of video, and the registers 16a through 16d will store digital signals associated with a later line (n−1) in the same video frame. Thus, each picture element in three consecutive lines is stored, and the method and structure described hereinafter combines and averages selected digital signals to provide a new resultant signal for each of the stored signals.

To establish a frame or reference by which to describe the operation of the comb filter, the picture element whose digital signal is stored in the register 20b is referred to herein as the reference picture element. Certain processing of other picture elements derives a new resultant signal for the reference picture element such that the phase of the chroma component of the reference picture element is inverted. After the resultant signal for the reference element has been developed, the system clocks the next successive picture element into the reference position and the same procedure is effected. Ultimately, each picture element of line (n), line (n−1) and all successive lines are clocked to the reference position (register 20b), and a new resultant signal is generated for each picture element of the television signal.

Figures 2, 3:
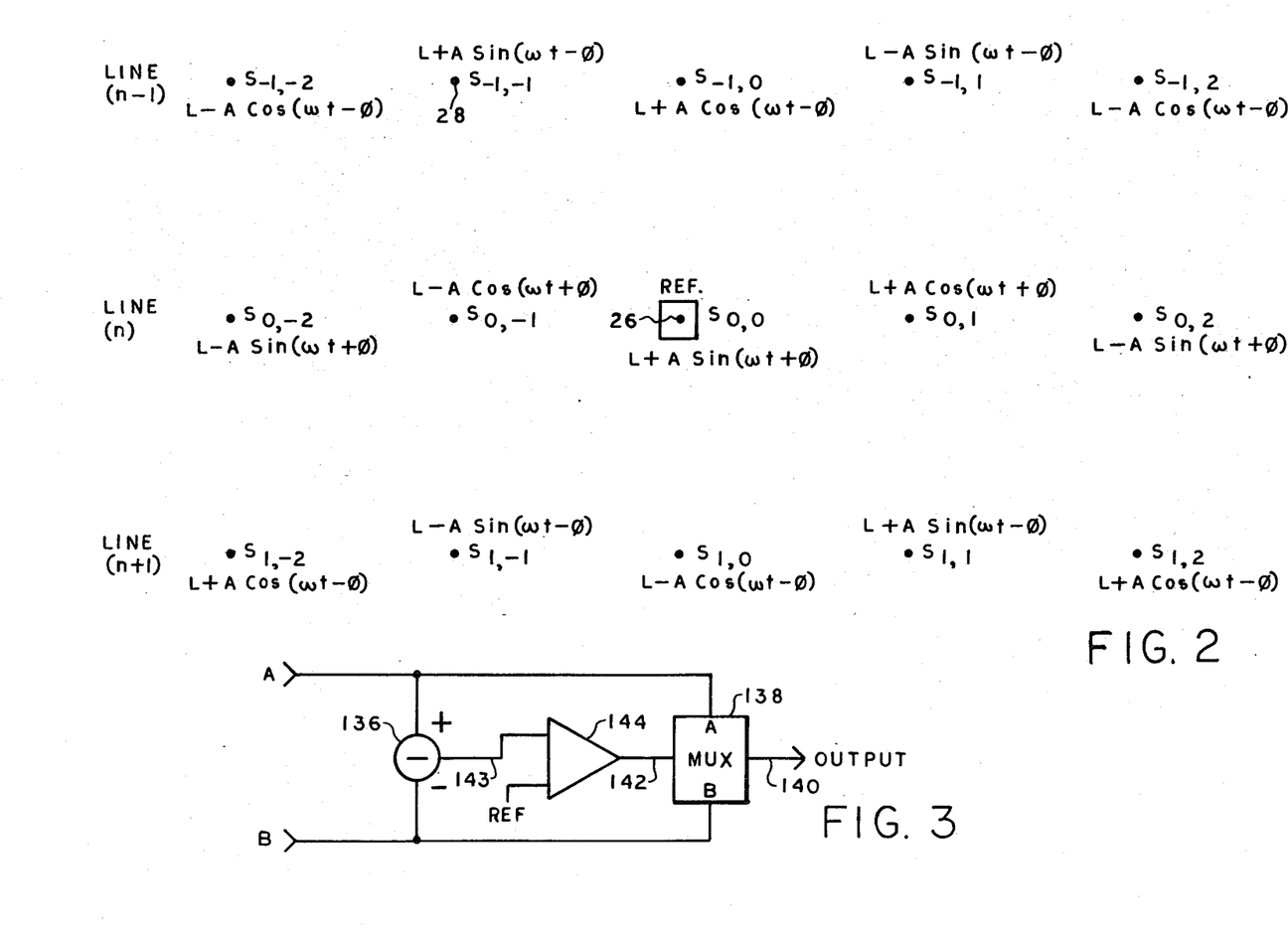
FIG. 2 illustrates an array of discrete picture elements useful in describing the operation of the invention.
FIG. 3 illustrates a general form of a difference detector for use in the filter of FIG. 1.

Referring now to FIG. 2, there is shown an array of picture elements grouped by lines and columns. The center element 26 is illustrated as a dot in a rectangle and is the reference element which is clocked from the register 20b. In FIG. 2, the reference element is indicated as having a position in the array of S(o,o). The remaining elements of the array are also shown as dots identified by their relative positions to the reference element 26. Generally, each picture element is associated with a location S(a, b) where "a" indicates the particular line the element is in and "b" indicates which column the element is in, as in a cartesian coordinate system. For example, the element 28 is located in position S(−1, −1), indicating that it is positioned in line occurring just after the reference line (n) and located one column to the left of the reference element 26. The correspondence between FIGS. 1 and 2 resides in the fact that the elements of FIG. 2 shown as being in line (n−1) are stored in the registers 16a through 16d, the elements shown as being in line (n) are stored in registers 20a through 20d, and the elements shown as being in line (n+1) are stored in registers 24a through 24d.

In phase alternating line (PAL) type television signals a mathematical relationship exists between the frequency of the chroma subcarrier $F_{SC}$ and the horizontal line frequency $F_H$. In some PAL signals, with which the present invention is particularly useful, this relationship is expressed mathematically as follows: $F_{SC} = K F_H + I$ where K is a constant and i is a constant referred to as the integration offset. PAL signals of this type which are presently in use are designated PAL-I, PAL-N, PAL-G, PAL-H, and PAL-B. However, the present invention is not limited in its applicability only to such systems as are presently in use. In all such presently used systems the integration offset is 25 HZ. The constant K is 283.75 in PAL-I, PAL-G, PAL-H, and PAL-B. The constant K is 229.25 in PAL-N.

The integration constant produces mathematical symmetry from line to line of the signal which is used to advantage in performing the comb filtering of the present invention.

As a result of the sampling which digitized the values of the picture elements, the latter have a symmetry as to the value of their chroma component. As shown in FIG. 2, which is applicable to PAL-I, PAL-G, PAL-H and PAL-B but not to PAL-N signals, every other picture element has a chroma component defined by the same trigonometric function and the same phase angle. For example, the element at location $S(-1, -2)$ is defined by $L - A \cos(wt - \emptyset)$ where L is the value of its luminance component, A is the chroma amplitude, wt is the chroma subcarrier, and $\emptyset$ is the phase of the chroma subcarrier relative to a reference phase of zero degrees. Every second picture element in line $(n-1)$ has a chroma component of $A \cos(wt - \emptyset)$, while other elements in the same line have chroma components defined by $A \sin(wt - \emptyset)$.

In line (n), the value of the chroma components alternates between $A \sin(wt + \emptyset)$ and $A \cos(wt + \emptyset)$. The chroma components of the picture elements in line $(n+1)$ are similar to those in line $(n-1)$.

Because the reference element 26 is to be compared to a correspondingly located S (0,0) element in the next successive frame, the chroma components of the two compared elements should be of the same phase. However, the picture element at location S(0,0) in the next successive frame has a value of $L + A \cos(wt - \emptyset)$; whereas the reference element has a value of $L + A \sin(wt + \emptyset)$. To convert the value of the reference element to the value of its counterpart element in the next successive frame, the comb filter combines and averages stored digital signals associated with selected picture elements in at least one of the lines $(n-1)$ and $(n+1)$ such that the resultant chroma signal is substantially free of luminance components and has substantially the same amplitude and phase as that of the picture elements S(0,0) in the next successive frame. As is described in more detail below, other picture elements are also combined and averaged to develop a resultant luminance signal substantially free of chrominance, and then the resultant luminance signal is combined with the resultant chroma signal to develop a final signal of the value $L + A \cos(wt - \emptyset)$.

Figure 4:
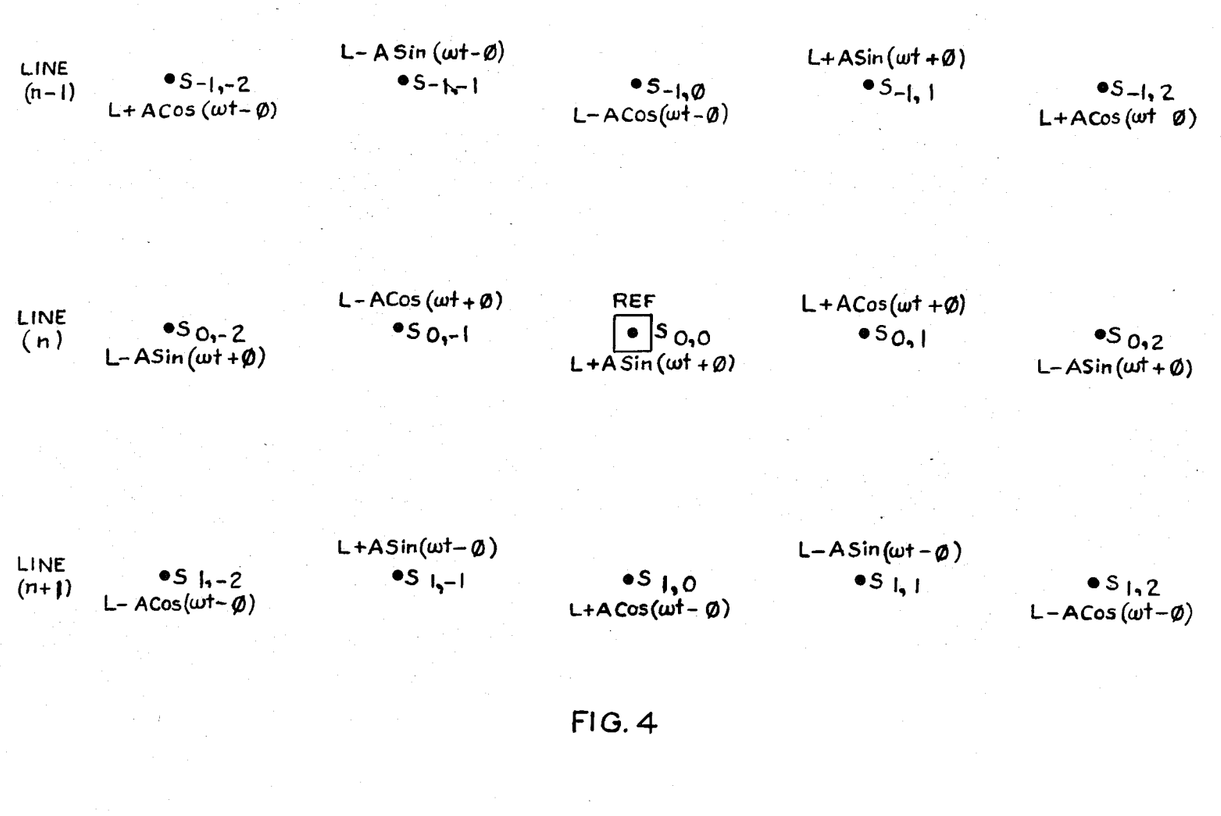
FIG. 4 illustrates an array of discrete picture elements similar to those shown in FIG. 2 in connection with a PAL-N type signal.

FIG. 4 shows that with a PAL-N type signal the mathematical expressions for the luminance and chroma components of each picture element differ from those shown for other PAL signals in FIG. 2. Specifically, the signs preceding the expressions for the respective chroma components are different. However, the process described in the preceding paragraph of comparing picture elements is essentially the same.

To develop the resultant chroma signal, values of selected picture elements having the same trigonometric function ($A \cos$) and phase angle ($wt - \emptyset$), as is desired for the resultant chroma signal, are combined and averaged. The selection of which picture elements are combined depends on whether the television signal represented by the stored digital signals has motion. If it does have motion, only selected picture elements in a single line are combined. If no motion is present, selected picture elements on both lines $(n-1)$ and $(n+1)$ are combined.

An exemplary and preferred combination of picture elements for developing the resultant chroma signal is illustrated in Table 1.

Table 1

$C1 = [S(-1,0) - S(1,0)] \div 2$
$C2 = S(-1,0) - S(-1,-2)$
$C3 = S(-1,0) - S(-1, 2)$
$C4 = S(1,-2) - S(1, 0)$
$C5 = S(1, 2) - S(1, 0)$
$C7 = (C2 + C3) \div 4$
$C8 = (C4 + C5) \div 4$
$CR = C7$ for motion
$CR = C1 \div 2 + [(C7 + C8) \div 4]$ for no motion The factors C1 through C8 are used to determine a resultant chroma signal, CR. As indicated in Table 1, the value of CR depends on whether motion is detected in the television signal. The way in which such motion is detected is described below. For now, an example of the way in which the table is used will be given.

Assuming that motion is detected in the television signal, the desired CR will equal C7 which, in turn, equals $(C2 + C3) \div 4$. To determine the value for C2, the mathematical description of picture elements $S(-1, 0)$ and $S(-1, -2)$ are determined from FIG. 2 and are subtracted from each other. Thus, $C2 = [L + A \cos(wt - \emptyset)] - [L - A \cos(wt - \emptyset)] = 2 A \cos(wt - \emptyset)$. Using the same procedure for C3, the latter equals $(L + A \cos(wt - \emptyset)) - [L - A \cos(wt - \emptyset)] = 2A \cos(wt - \emptyset)$. CR equals $C7 = (C2 + C3) \div 4 = A \cos(wt - \emptyset)$. Thus, the resultant chroma signal is of the proper amplitude and phase for comparison with the picture element in the next successive frame which is at location S(o,o).

It will be noted that the picture elements utilized, $S(-1,0), S(-1, -2), S(-1,2)$, to generate the resultant chroma signal are all from line $(N-1)$. This is because the generation of the resultant chroma signal is actually an approximation developed by combining and averaging a number of picture elements, and, when motion is detected, more error would be introduced into the approximation if picture elements from different lines were used in the approximation. Hence, when motion occurs in the television signal, it is preferable to generate the resultant chroma signal only from picture element values in one television line, such as line $(n-1)$. The resultant chroma signal could also have been generated from picture element values taken from line $(n+1)$.

When no motion is detected in the television signal, the resultant chroma signal is approximated by combining and averaging picture element values in both the lines $(n-1)$ and $(n+1)$. Employing Table 1, it can be shown that the picture elements of line $(n-1)$ which are used to derive the resultant chroma signal are $S(-1, -2), S(-1, 0)$, and $S(-1, 2)$. The picture elements of line $(n+1)$ which are employed are $S(1, -2), S(1, 0)$ and $S(1, 2)$. Thus, picture elements used to develop the resultant chroma signal when no motion is detected are those of lines $(n-1)$ and $(n+1)$ which are in the same column as the reference element 26 and those spaced from the reference element by two columns. When motion is detected, the picture elements which are combined and averaged are those of line $(n-1)$ which are in the same column as the reference element 26 and which are spaced from the reference element by two columns.

As stated earlier, a resultant luminance signal is also developed for combining with the resultant chroma signal. Table 2 indicates the preferred picture elements which are combined and averaged to develop that resultant signal.

Table 2

$L1 = [S(0, -1) + S(0,1)] \div 2$
$L2 = [S(-1,0) + S(1,0)] \div 2$
$L3 = L1$ when motion is detected.
$L3 = (L1 + L2) \div 2$ when no motion is detected.

The determination of L1, L2 and L3 is the same as that described above for the chroma signal. That is, the mathematical relationship describing each picture element is inserted in the proper equation of Table 2. When motion is detected, the resultant luminance signal LR is a function only of selected picture elements in the line (n), namely, $S(0,-1)$ and $S(0,1)$. When no motion is detected, LR is a function of selected picture elements in lines (n), (n+1) and (n−1), namely $S(0,-1)$, $S(0,1)$, $S(-1,0)$ and $S(1,0)$. In either case (motion or no motion), the resultant luminance signal can be shown to be equal to L, where "L" is used in the sense shown in FIG. 2. Thus, when the resultant luminance signal is combined with the resultant chroma signal (for motion or no motion), the final combined signal is equal to $L + A \cos(wt - \emptyset)$. This final signal has, of course, the same average luminance and chroma amplitude as the picture element R at location $S(0,0)$ in the next successive frame, and the amplitude of the chroma component varies according to the same trigonometric function and angle as that of the element R.

After the final combined signal has been developed for the reference element 26, all of the picture elements are clocked to the right by one position in FIG. 2. Thus, the picture element previously at location $S(0,-1)$ is moved to position $S(0,0)$ and becomes the new reference element. The same procedure employing Tables 1 and 2 is then repeated to determine a final combined signal for the new reference element. The same procedure is used for all the picture elements in line (n), after which the line (n−1) is treated as new line (n) and every picture element in new line (n) is individually treated as a reference picture element. The procedure continues until each picture element in the reference frame has been treated as a reference picture element. Then, the next successive frame is treated as a reference frame. In this manner, every picture element associated with the digitized television signal is given an average chroma component whose phase angle has been corrected for comparison with the picture element occupying the same relative position in the next successive frame.

Referring again to FIG. 1, the factor C1 is developed by coupling a lead 30 between the output of the register 24b and the negative input of a subtractor 32, coupling a lead 34 between the output of the register 16b and the positive input to the subtractor 32, and by coupling a divide-by-two divider 36 to the output of the subtractor 32. With this arrangement, the lead 30 carries the digital signal associated with the picture element $S(1,0)$, the lead 34 carries the digital signal associated with the picture element $S(-1,0)$, the output of the subtractor 32 corresponds to $S(-1,0) - S(1,0)$, and the output of the divider 36 equals C1.

The factor C2 is developed by coupling a lead 38 between the input to the register 16a and the negative input of a subtractor 40, and by coupling a lead 42 between the output of the register 16b and the positive input to the subtractor 40. The lead 42 carries the digital signal associated with the picture element $S(-1, -2)$, and the output of the subtractor 40 at lead 44 corresponds to C2.

To develop the factor C3, a subtractor 46 receives at its positive input the digital signal associated with the picture element $S(-1, 0)$ via the lead 42, and receives at its negative input via lead 47 a digital signal associated with the picture element $S(-1, 2)$. The factor C3 is developed at the output of the subtractor 46 and is coupled to one input of an adder 48. The other input to the adder 48 is the factor C2 from the subtractor 40. The output of the adder 48 is applied to a divide-by-four divider 50 whose output on lead 52 corresponds to C7.

To develop the factor C4, a subtractor 54 receives at its positive input via a lead 56 a digital signal associated with the picture element $S(1,-2)$. The negative input to the subtractor 54 is taken from a lead 58 which is coupled to the output of the register 24b and which carries a digital signal associated with the picture element $S(1,0)$. The output of the subtractor 54 appears on a lead 60 and corresponds to the factor C4.

Another subtractor 62 is coupled at its negative input to the lead 58 and at its positive input to the output of the register 24d via a lead 64 which carries a digital signal associated with the picture element $S(1, 2)$. The output of the subtractor 62 on lead 66 corresponds to the factor C5 which is applied as one input to an adder 68. The lead 60 carries the factor C4 to the other input of the adder 68 for developing at lead 70 a signal corresponding to $C4 + C5$.

The factor C8 is developed by coupling the lead 70 to a divide-by-four divider 72. The output C8 of the divider 72 appears on a lead 74.

The first step in further developing the resultant chroma signal is to determine whether motion is present in the television signal. In the illustrated embodiment, this is achieved by sensing whether a difference exists between the stored digital signals which define the factors C7 and C8. Specifically, a difference detector 76 receives the factor C8 via lead 74, the factor C7 via a lead 78 and a reference signal R1. The specifics of the difference detector 76 are described hereinafter. Suffice it to say at this juncture that the detector 76 determines the difference between its inputs C7 and C8 and compares that difference to the reference signal R1. If the difference between C7 and C8 exceeds R1, it is assumed that a predetermined amount of motion is present in the television signal. Under that condition, the detector 76 outputs the factor C7 on lead 80. When the difference between C7 and C8 is less than R1, it is assumed that no significant motion is present, whereupon the detector 76 outputs the factor C8 to lead 80.

As shown, the lead 80 is coupled to one input of an adder 82, the other input of which receives the factor C7 via lead 52. The output of the adder 82 is applied to a divide-by-two divider 84, the output of which appears on lead 86. With this arrangement, the signal on the lead 86 corresponds to C7 when motion is sensed by the detector 76. When no motion is sensed, the signal on the lead 86 corresponds to $(C7+C8) \div 2$.

To further develop the resultant chroma signal, the lead 86 is coupled to an adder 88 and to one input of another difference detector 90. The detector 90 also receives a reference signal R2 and the factor C1 from the divider 36. When the difference between C1 and the signal on lead 86 exceeds the reference signal R2 (indicating motion in the television signal), the detector 90 outputs to lead 92 the signal received from lead 86. Because the lead 86 carries a signal corresponding to C7 when the detector 76 senses motion, the output of the detector 90 also corresponds to C7 when motion is sensed. In that condition, the adder 88 receives a signal corresponding to C7 from lead 86 and another signal corresponding to C7 from lead 92. The output of the adder 88 ($2 \times C7$) is applied to a divide-by-two divider 94 whose output at lead 96 corresponds to the resultant chroma signal. In the case wherein motion in the television signal is sensed, the signal on the lead 96 corresponds to C7. When no motion is sensed, the signal on the lead 96 corresponds to (C7+C8)÷2, and the output of the detector 90 correponds to C1. Consequently, the signal on the lead 96 then corresponds to C1/2+(C7+C8)/4.

The output at lead 96 is a signal containing substantially only chroma components and corresponds to A Cos (wt−∅) where the amplitude A is averaged from the selected picture element values. However, the luminance values of the selected picture elements may not always be of exactly the same amplitude. Hence, in the process of combining selected picture element values to cancel out the luminance components thereof, some small residual luminance components may be present in the resultant chroma signal on the lead 96. To remove these luminance components, the resultant chroma signal may be coupled to a conventional digital bandpass filter 98 whose bandpass may be approximately 2.5 to 5.5 megahertz. The output of the filter 98 is coupled via a lead 100 to one input of a combining element 102 for combining the resultant chroma signal with a resultant luminance signal. In operation, with a PAL-N type signal, combining element 102 is an adder. However, for other PAL signals such as PAL-I, PAL-G, PAL-H and PAL-B combining element 102 is a subtractor.

To generate the resultant luminance signal, the factor L1 is first developed by coupling an adder 104 to the output of the register 20a via a lead 106 and also to the output of the register 20c via another lead 108. The adder 104 thus receives via lead 106 a digital signal associated with the picture element S(0,−1) and via the lead 108, the digital signal associated with the picture element S(0,1). The output of the adder 104 is coupled to a divide-by-two divider 110 whose output at lead 112 corresponds to the factor L1.

In the development of the factor L2, an adder 114 receives a digital signal associated with the picture element S(−1,0) via the lead 34 and a digital signal associated with the picture element S(1,0) via the lead 30. The output of the adder 114 is coupled to a divide-by-two divider 116 whose output at lead 118 corresponds to the factor L2.

The resultant luminance signal is further developed by coupling the leads 112 and 118 to another difference detector 120 which also receives another reference signal R3, as shown. The output of the detector 120 is coupled via a lead 122 to one input of another adder 124, the latter of which has its other input coupled to the lead 112. Assuming that motion is present in the television signal, the difference detector 120 will determine that the difference between the signals received on leads 112 and 118 exceeds the reference signal R3, whereupon the detector 120 passes the signal on lead 112 (L1) to its output lead 122. Consequently, the output of the adder 124 corresponds to 2×L1. That signal is coupled to a divide-by-two divider 126 whose output at the lead 128 corresponds to the resultant luminance signal which, in this case, equals L1.

When no motion is detected in the television signal, the difference detector 120 outputs to lead 122 the signal L2 received via lead 118. Hence, the output of the adder 124 then corresponds to L1+L2, and the resultant luminance signal at lead 128 now corresponds to (L1+L2)/2.

As with the resultant chroma signal, the resultant luminance signal on the lead 128 may include some unwanted residuals, due to the fact that the picture elements selected to develop the resultant luminance signal may have chroma components which are slightly different. Hence, the signal at lead 128 may contain some residual chroma components which may be eliminated by passing the resultant luminance signal through a conventional digital low pass filter 130. The output of the filter 130 corresponds to a resultant luminance signal having very little or no chroma components and is coupled via a lead 131 to one input of the combining element 102. The output of the combining element 102 corresponds to a final signal which may be described mathematically by L±A Cos (wt−∅). This latter signal may then be compared to the picture element in the next successive frame whih is located at S(0,0).

Although the embodiment of FIG. 2 has been depicted as carrying signals from one element to another via a single line, it should be understood that each of those lines represents a group of lines which collectively carries a signal. For example, the lead 114 carrying the digitized video signal to the register 16a may in fact be 8 lines, each carrying a single bit of digitized video.

When the digitized video has been processed as described above, the output of the adder 102 may include more bits than is necessary to further process the final combined signal. Hence, the output of the combining element 102 may be coupled to a circuit 132 for rounding off the final signal to the desired number of bits. The rounded off signal appears at a lead 134 and constitutes the final output of the comb filter.

The difference detectors employed in the filter of FIG. 1 may be of the general form illustrated in FIG. 3. As shown, the detector receives inputs A and B which are applied to a subtractor 136 and to a conventional multiplexer 138. The multiplexer 138 outputs to lead 140 either the signal A or the signal B, depending on the value of a control signal received from lead 142.

The subtractor 136 generates a signal at lead 143 indicative of the absolute value of the difference between A and B. That difference is applied as an input to a comparator 144, the other input to which is a reference signal. When the value of the difference signal exceeds the value of the reference signal, the comparator generates a control signal, in response to which the multiplexer outputs signal A. When the value of the reference signal exceeds the value of the difference signal, the value of the control signal developed on lead 142 causes the multiplexer to output signal B.

The comb filtering technique described above is particularly useful in conjunction with a recursive noise filter of the digital type for processing television signals. As stated earlier, one such recursive filter is described in U.S. application Ser. No. 041,455, filed May 22, 1979, entitled NOISE FILTER, and assigned to the assignee of this invention. To employ the comb filter and technique described herein, the block 30 entitled "Chroma Invert" of FIG. 1 of the above-mentioned application may be removed and the comb filter shown in FIG. 1 herein may be substituted therefor. In that case, the sampler 12 herein may be removed because the signal at that point in the filter is already digitized. With that change, the recursive noise filter described in the above-mentioned application is suitable for processing television signals encoded according to PAL standards.

Although the invention has been described in terms of specific preferred structure and steps, it will be obvious to those skilled in the art that many alterations and modifications thereto may be made. Accordingly, it is intended that all such alterations and modifications be included within the spirit and scope of the invention as defined by the appended claims.

What is claimed is:

1. A method of correcting the phase of the chroma component of a reference picture element in a reference video frame of a PAL type television signal, comprising:
    (a) sampling the television signal at a rate corresponding to N times the chroma subcarrier frequency of the television signal, where N is an even integer, thereby to generate a series of digital signals each associated with a discrete picture element and each representative of the amplitude of the luminance component and amplitude and phase of the chroma component of its associated picture element;
    (b) storing the digital signals associated with the picture elements of a reference line (n) of a reference frame of the television signal, and storing the digital signals associated with the picture elements in lines (n+1) and (n−1) immediately preceding and following the reference line (n), respectively; and
    (c) combining and averaging stored digital signals associated with selected picture elements in at least one of the lines (n−1) and (n+1) such that the resultant chroma signal is substantially free of luminance components and has substantially the same amplitude and phase as that of a picture element which is in the next successive frame immediately following the reference frame and whose location corresponds to the location of the reference picture element,
    whereby the amplitude and phase of the chroma components of correspondingly located picture elements in successive frames are rendered substantially the same for comparison with each other.

2. A method as set forth in claim 1 including individually treating each picture element of the reference line (n) as a new reference picture element, repeating steps (b) and (c) for each such new reference picture element, individually treating each line following the reference line (n) as a new reference line and each picture element therein as a new reference picture element, and repeating steps (b) and (c) for each such new reference picture element, whereby a new resultant signal is generated for each picture element of a frame.

3. A method as set forth in claim 1 including detecting motion and the lack thereof occurring in that part of the television signal associated with stored digital signals, wherein said selected picture elements are selected from only one of the lines (n−1) and (n+1) when such motion is detected, and wherein said selected picture elements are selected from picture elements in both of the lines (n−1) and (n+1) when no such motion is detected.

4. A methot as set forth in claim 3 wherein a picture element (R) in the next successive frame has a location corresponding to the location of the reference picture element, wherein the chroma component of the picture element (R) varies according to a given trigonometric function and angle, and wherein only stored digital signals associated with picture elements having a chroma component which varies according to the given trigonometric function and angle are combined and averaged.

5. A method as set forth in claim 4 wherein the picture elements are defined by an array of picture elements in horizontal lines and vertical columns and wherein, when motion is detected, a digital signal associated with a first picture element in the same vertical column as the reference picture element is combined and averaged with second and third digital signals associated with picture elements in the same line as the first picture element but spaced therefrom by two columns.

6. A method as set forth in claim 5 wherein said first, second, and third picture elements are all located in line (n−1).

7. A method as set forth in claim 4 wherein the picture elements are defined by an array of picture elements in horizontal lines and vertical columns and wherein, when no motion is detected, the digital signals which are combined and averaged include those associated with picture elements in the same column as the reference picture element and those spaced from the reference picture element by two columns.

8. A method as set forth in claim 1 further including combining and averaging stored digital signals associated with selected picture elements so as to develop a resultant luminance signal substantially free of chroma components, and combining the resultant luminance signal with the resultant chroma signal.

9. A method as set forth in claim 8 including detecting motion and the lack thereof occurring in that part of the television signal associated with stored digital signals, generating the resultant luminance signal by combining and averaging stored digital signals associated with selected picture elements in lines (n), (n+1) and (n−1) when no motion is detected, and by combining and averaging stored digital signals associated with selected picture elements only in line (n) when motion is detected.

10. A method as set forth in claim 9 wherein, when motion is detected, the resultant luminance signal is generated by combining and averaging the stored digital signals associated with the two picture elements on either side of the reference picture element.

11. A method as set forth in claim 9 wherein, when no motion is detected, the resultant luminance signal is generated by combining and averaging stored digital signals associated with the two picture elements in line (n) which are adjacent the reference picture element and the two picture elements in lines (n−1) and (n+1) which are in the same column as the reference picture element.

12. A method of correcting the phase of the color component of a reference picture element in a reference frame of a PAL type television signal, comprising:
    (a) sampling the television signal at a rate corresponding to N times the chroma subcarrier frequency of the television signal, where N is an even integer, thereby to generate a series of digital signals each associated with a discrete picture element and each representative of the amplitude of the luminance component and amplitude and phase of the chroma component of its associated picture element;
    (b) storing the digital signals associated with the picture elements of a reference line (n) of a reference frame of the television signal, and storing the digital signals associated with the picture elements in lines (n+1) and (n−1) immediately preceding and following the reference line (n), respectively; and
    (c) detecting motion and the lack thereof occurring in that part of the television signal associated with stored digital signals;
    (d) generating a resultant chroma signal by combining and averaging stored digital signals associated with selected picture elements in only one of the lines (n−1) and (n+1) when such motion is detected, and combining and averaging stored digital signals associated with selected picture elements in both the lines (n−1) and (n+1) when no such motion is detected, said combining and averaging being effected such that the resultant chroma signal is substantially free of luminance components and has substantially the same amplitude and phase as that of a picture element which is in the next successive frame immediately following the reference frame and whose location corresponds to the location of the reference picture element;

(e) generating a resultant luminance signal by combining and averaging stored digital signals associated with selected picture elements in at least two of the lines (n), (n+1), and (n−1) when no motion is detected, and by combining and averaging stored digital signals associated with selected picture elements in only one of the lines (n), (n+1), and (n−1) when motion is detected, said combining and averaging being effected such that the resultant luminance signal is substantially free of chroma components; and (f) combining the resultant luminance signal with the resultant chroma signal to develop a final signal.

13. A method as set forth in claim 12 including individually treating each picture element of the reference line (n) as a new reference picture element, repeating steps (b) through (f) for each such new reference picture element, individually treating each line following the reference line (n) as a new reference line and each picture element therein as a new reference picture element, and repeating steps (b) through (f) for each such new reference picture element, whereby a new final signal is generated for each picture element of a frame.

14. A method as set forth in claim 13 wherein a picture element (R) in the next successive frame has a location corresponding to the location of the reference picture element, wherein the chroma component of the picture element (R) varies according to a given trigonometric function and angle, and wherein the resultant chroma signal is generated by combining and averaging only stored digital signals associated with picture elements having a chroma component which varies according to the given trigonometric function and angle.

15. A comb filter for correcting the phase of the color component of a reference picture element in a reference frame of a PAL type television signal, comprising:

means for sampling the television signal at a rate corresponding to N times the chroma subcarrier frequency of the television signal, where N is an even integer, thereby to generate a series of digital signals each associated with a discrete picture element and each representative of the amplitude of the luminance component and amplitude and phase of the chroma component of its associated picture element;

means for storing the digital signals associated with the picture elements of a reference line (n) of a reference frame of the television signal, and storing the digital signals associated with the picture elements in lines (n+1) and (n−1) immediately preceding and following the reference line (n), respectively; and means for combining and averaging stored digital signals associated with selected picture elements in at least one of the lines (n−1) and (n+1) such that the resultant chroma signal is substantially free of luminance components and has substantially the same amplitude and phase as that of a picture element which is in the frame (n−1) immediately following the reference frame and whose location corresponds to the location of the reference picture element, whereby the amplitude and phase of the chroma components of correspondingly located picture elements in successive frames are rendered substantially the same for comparison with each other.

16. A filter as set forth in claim 15 including means for detecting motion and the lack thereof occurring in that part of the television signal associated with stored digital signals, means for combining and averaging stored digital signals associated with selected picture elements in only one of the lines (n−1) and (n+1) when such motion is detected, and for combining and averaging stored digital signals associated with selected picture elements in both of the lines (n−1) and (n+1) when no such motion is detected.

17. A filter as set forth in claim 15 wherein a picture element (R) in the next successive frame has a location corresponding to the location of the reference picture element, wherein the chroma component of the picture element (R) varies according to a given trigonometric function and angle, and wherein only stored digital signals associated with picture elements having a chroma component which varies according to the given triginometric function and angle are combined and averaged.

18. A filter as set forth in claim 15 including luminance generating means for combining and averaging stored digital signals associated with selected picture elements so as to develop a resultant luminance signal substantially free of chroma components, and means for combining the resultant luminance signal with the resultant chroma signal.

19. A filter as set forth in claim 18 including motion sensor means for detecting motion and the lack thereof occurring in that part of the television signal associated with stored digital signals, and wherein said luminance generating means is responsive to said motion sensor detecting a lack of motion for combining and averaging stored digital signals associated with selected picture elements in lines (n), (n+1) and (n−1), and responsive to said motion sensor detecting motion for combining and averaging stored digital signals associated with selected picture elements only in line (n).

20. A comb filter for correcting the phase of the color component of a reference picture element in a reference frame of a PAL type television signal, comprising:

means for sampling the television signal at a rate corresponding to N times the chroma subcarrier frequency of the television signal, where N is an even integer, thereby to generate a series of digital signals each associated with a discrete picture element and each representative of the amplitude of the luminance component and amplitude and phase of the chroma component of its associated picture element;

means for storing the digital signals associated with the picture elements of a reference line (n) in a reference frame of the television signal, and storing the digital signals associated with the picture elements in lines (n+1) and (n−1) immediately preceding and following the reference line (n), respectively;

motion sensing means for detecting motion and the lack thereof occurring in that part of the television signal associated with stored digital signals;

means for generating a resultant chroma signal by combining and averaging stored digital signals associated with selected picture elements in only one of the lines (n−1) and (n+1) when such motion is detected, and combining and averaging stored digital signals associated with selected picture elements in both the lines (n−1) and (n+1) when no such motion is detected, sad combining and averaging being effected such that the resultant chroma signal is substantially free of luminance components and has substantially the same amplitude and phase as that of a picture element which is in the frame immediately following the reference frame and whose location corresponds to the location of the reference picture element;

means for generating a resultant luminance signal by combining and averaging stored digital signals associated with selected picture elements in at least two of the lines (n), (n+1), and (n−1) when no motion is detected, and by combining and averaging stored digital signals associated with selected picture elements in only one of the lines (n), (n+1), and (n−1) when motion is detected, said combining and averaging being effected such that the resultant luminance signal is substantially free of chroma components; and means for combining the resultant luminance signal with the resultant chroma signal to develop a final signal.

21. A filter as set forth in claim 20 wherein a picture element (R) in the next successive frame has a location corresponding to the location of the reference picture element, wherein the chroma component of the picture element (R) varies according to a given trigonometric function and angle, and wherein said chroma signal generating means combines and averages only stored digital signals associated with picture elements having a chroma component which varies according to the given triginometric function and angle.

* * * * *